United States Patent
Harrison et al.

(10) Patent No.: US 12,334,360 B2
(45) Date of Patent: Jun. 17, 2025

(54) LASER FABRICATION OF LEAD SELENIDE THIN FILM

(71) Applicants: Joel T. Harrison, Henrico, VA (US); Mool C. Gupta, Keswick, VA (US)

(72) Inventors: Joel T. Harrison, Henrico, VA (US); Mool C. Gupta, Keswick, VA (US)

(73) Assignee: United States of America, as represented by the Secretary of the Navy, Arlington, VA (US)

(*) Notice: Subject to any disclaimer, the term of this patent is extended or adjusted under 35 U.S.C. 154(b) by 663 days.

(21) Appl. No.: 17/732,775

(22) Filed: Apr. 29, 2022

(65) Prior Publication Data

US 2022/0359226 A1    Nov. 10, 2022

Related U.S. Application Data

(60) Provisional application No. 63/184,256, filed on May 5, 2021.

(51) Int. Cl.
*H01L 21/477* (2006.01)
*H01L 21/02* (2006.01)

(52) U.S. Cl.
CPC ...... *H01L 21/477* (2013.01); *H01L 21/02354* (2013.01)

(58) Field of Classification Search
CPC ............ H01L 21/477; H01L 21/02354
See application file for complete search history.

(56) References Cited

U.S. PATENT DOCUMENTS 9,825,214 B1 *  11/2017  Reeves ............... H10F 71/00

OTHER PUBLICATIONS

Lee et al., "Thermoelectric properties of $Bi_{0.5}Sb_{1.5}Te_3/Ag_2Te$ bulk composites with size- and shape controlled $Ag_2Te$ nano-particles dispersion," 2016, Journal of Alloys and Compounds 657, pp. 639-645. (Year: 2016).*
H. Wang et al.: "$Mg_xZn_{1-x}O$ films synthesized by laser sintering method and UV detectors" *J. of Alloys and Compounds* 847 (2020). https://www.sciencedirect.com/sdfe/reader/pii/S0925838820328243/pdf.
J. T. Harrison et al.: "Laser sintered PbSe semiconductor thin films for Mid-IR applications using nanocrystals" *J. of Alloys and Compounds* 849 (2020). https://www.sciencedirect.com/science/article/pii/S0925838820329017/pdf.

* cited by examiner

*Primary Examiner* — Robert A Vetere
(74) *Attorney, Agent, or Firm* — Gerhard W. Thielman

(57) ABSTRACT

A laser sintering deposition method is provided for disposing lead selenide onto a substrate. The method includes: wet-milling a lead selenide ingot mixed with methanol into a colloidal slurry containing nanocrystals; separating the colloidal slurry into nanocrystal particles and the methanol; depositing the nanocrystal particles to a substrate; and emitting coherent infrared light onto the nanocrystal particles for fusing into a lead selenide crystalline film. Afterwards, the lead selenide film can be exposed to oxygen to form a lead selenite layer, and subsequently to iodine gas to produce a lead iodide layer onto the lead selenite layer.

15 Claims, 6 Drawing Sheets

Table 4 Concentration of PbSe and solvent per milling batch and per sample via centrifuge deposition

| PbSe NC Concentrate (Post milling) | | | Methanol Dilution (for centrifuge) | | | |
|---|---|---|---|---|---|---|
| Silicon substrate | PbSe milled (g) | Methanol (mL) | Volume of Soln. (mL) | PbSe NC (mg/vial) | Vial Size (mL) | Methanol (mL/vial) |
| 10 mm x 20 mm | 0.5 | 55 | 0.4 | 3.6 | 20 | 10 |
| 50 mm wafer | 0.5 | 55 | 2.2 | 19.2 | 200 | 100 |

FIG. 3

LASER FABRICATION OF LEAD SELENIDE THIN FILM

CROSS REFERENCE TO RELATED APPLICATION

Pursuant to 35 U.S.C. § 119, the benefit of priority from provisional application 63/184,256, with a filing date of May 5, 2021, is claimed for this non-provisional application.

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to semi-conductor fabrication. In particular, the invention relates to employing laser sintering to produce thin films with layers of lead selenide.

Over the past seven decades, inorganic compounds called lead chalcogenides have been researched for their unique room-temperature photosensitivity to infrared (IR) radiation. In particular, lead (Pb) has been combined with selenium (Se) to produce lead selenide (PbSe). Their semiconductive properties can be exploited in the form of a polycrystalline thin film used as a photodetector of mid-wave infrared (MWIR) wavelengths (3 μm-5 μm).

Rapid advances in material science, fabrication process controls, and solid-state physics have resulted in more sensitive detectors fabricated using more complex compound materials integrated into a multilayer stacked design. However, such detector fabrication techniques involve high complexity and significant manufacturing costs. Alternatively, thermal management requirements that involve external cooling have limited their insertion into many commercial and military applications

SUMMARY

Conventional thin film deposition techniques for lead chalcogenides yield disadvantages addressed by various exemplary embodiments of the present invention. In particular, exemplary embodiments provide a laser sintering deposition method for depositing lead selenide onto a substrate.

The method includes: wet milling a lead selenide (PbSe) ingot mixed with methanol into a colloidal slurry of micro- and nanocrystals; depositing the particles onto a substrate; and emitting coherent infrared light onto these particles for fusing into a lead selenide polycrystalline film. In additional embodiments, the lead selenide film can be exposed to oxygen to form a lead selenite ($PbSeO_3$) layer, and subsequently exposed to iodine to produce a lead iodide ($PbI_2$) layer onto the lead selenite layer. These two processes are called thermal sensitization.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIG. 3 is a tabular view of concentrations of lead selenide ball milled in methanol and colloidal lead selenide distributed to vials for centrifugal deposition;

DETAILED DESCRIPTION

Figure 1:
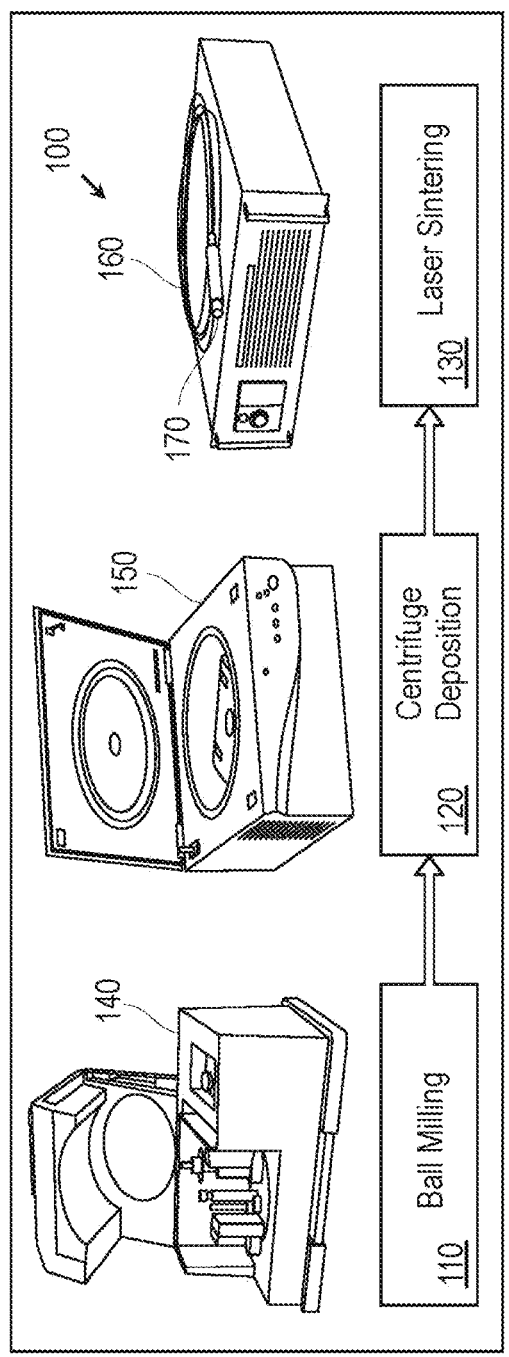
FIG. 1 is a representational view of an exemplary lead selenide film formation process.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

In accordance with a presently preferred embodiment of the present invention, the components, process steps, and/or data structures may be implemented to produce hardwire devices that constitute and/or incorporated in a computing platform, an application specific integrated circuit (ASIC), a field programmable gate array (FPGA), a digital signal processor (DSP), a focal plane array (FPA) or other related component.

The disclosure generally employs quantity units with the following abbreviations: length in centimeters (cm), micrometers (μm), nanometers (nm), or ångströms (Å), volume in milliliters (mL), mass in grams (g), time in hours (hr), minutes (min) or seconds(s), temperature in degrees Celcius (° C.) or kelvins (K), energy in joules (J), and frequencies in gigahertz (GHz).

Supplemental measures can be derived from these, such as density in grams-per-cubic-centimeters ($g/cm^3$), moment of inertia in gram-square-centimeters ($kg\text{-}m^2$) and the like. The following elements are referenced either frequently or occasionally in this disclosure (in order of atomic number): hydrogen ($H_2$), nitrogen ($N_2$), oxygen ($O_2$), aluminum (Al), silicon (Si), sulfur (S), argon (Ar), potassium (K), copper (Cu), gallium (Ga), arsenic (As), selenium (Se), zirconium (Zr), tellurium (Te), iodine ($I_2$), gold (Au) and lead (Pb). Various compounds described herein include: methanol ($CH_3OH$), ammonium iodide ($NH_4I$), potassium iodide (KI), zirconium oxide ($ZrO_2$), lead selenide (PbSe), lead selenite ($PbSeO_3$), lead iodide ($PbI_2$), etc.

ABBREVIATIONS COMMONLY EMPLOYED HEREIN INCLUDE THE FOLLOWING

CBD chemical bath deposition—process
CW continuous wave—laser
EDS energy dispersive spectroscopy EM electromagnetic
FPA focal plane array
IR infrared (EM wavelengths $\lambda$=700 nm-1 mm)
LSD laser sinter deposition—process
MWIR mid-wave infrared (EM wavelengths $\lambda$=3 µm-5 µm)
NC nanocrystal
PVD physical vapor deposition—process
QPW quasi-pulsed wave—laser
SDS selective depth sintering
SEM scanning electron microscopy
UV ultraviolet (EM wavelengths $\lambda$=200 nm-400 nm)
XRD x-ray diffraction Two technical papers address laser sintering for thin film application—H. Wang et al.: "$Mg_xZn_{1-x}O$ films synthesized by laser sintering method and UV detectors" *J. of Alloys and Compounds* 847 (2020) at https://iww.sciencedirect.com/sdfe/reader/pii/S0925838820328243/pdf and J. T. Harrison et al.: "Laser sintered PbSe semiconductor thin films for Mid-IR applications using nanocrystals" *J. of Alloys and Compounds* 849 (2020) at https://www.sciencedirect.com/science/article/pii/S0925838820329017/pdf, the latter of which being relevant to exemplary embodiments described herein, for among other reasons the nature of the particular inorganic material under application.

Lead chalcogenides represent inorganic compounds with lead (Pb) combined with one of sulfur (S), selenium (Se) or telluride (Te). Interest has resurged in lead chalcogenides, in particular lead selenide (PbSe), for three primary reasons:
  (a) high-photoresponse at room temperature;
  (b) simple fabrication; and
  (c) large Bohr exciton radius (46 nm for PbSe).
These characteristics enable bandgap tuning of photosensitivity to shorter wavelengths with quantum dots.

This disclosure focuses on lead selenide (PbSe), although much of the description also applies to lead sulfide and lead telluride as well. In particular, lead selenide has a narrow bulk bandgap of 0.28 eV and a quantum dot bandgap range between 0.28 eV-1.7 eV at wavelength of 4.4 µm. The narrow intrinsic (bulk) bandgap of lead selenide enables sensitivity to the mid-wave infrared (MWIR) regime of the electromagnetic (EM) spectrum (3 µm-5 µm wavelength). The relatively large Bohr exciton radius provides strong quantum confinement characteristics. Each of these properties is interesting alone but combined, enables an exceptional ability to shift the bandgap and spectral range of optical photoresponsivity with relative ease. Furthermore, the large Bohr radius enables relatively reproducible and straightforward processing for polycrystalline thin film to obtain nanocrystals with unique properties. This facilitates investigation of quantum size effects with particle dimensions more stable due to a smaller surface-to-volume ratio.

In recent years other improvements have been made as research into these unique materials increases. However, the methods for thin film deposition remain fairly unchanged. With the exception of quantum dot synthesis, most thin films (0.5 µm-2 µm) for MWIR applications are deposited using one of two conventional method techniques:
  (1) physical vapor deposition (PVD), e.g., thermal evaporation and sputtering;
  (2) chemical bath deposition (CBD);
  (3) pulsed laser deposition (PLD);
  (4) molecular beam epitaxy (MBE);
  (5) atomic layer deposition (ALD);
  (6) chemical vapor deposition (CVD), e.g., low pressure (LPCVD) and plasma-enhanced (PECVD).
The instant disclosure describes an exemplary alternative:
  (7) laser sinter deposition (LSD).

Both conventional deposition methods have their own set of benefits and limitations. While significant efforts have resulted in PVD improvements, CBD deposition remains much more common, and produces the highest photosensitivity at the lowest cost for conventional processes. Nonetheless, CBD suffers from cross-sample non-uniformity (thickness, morphology, stoichiometry, etc.), poor substrate adhesion requiring substrate surface treatment, and poor process control leading to sample-to-sample variation.

Moreover, CBD requires a wet chemical deposition process incompatible for easy integration with silicon (Si) CMOS technology, has limited process control due to strong dependency on substrate temperature and bath pH; slow deposition rates with radial dependent properties (center-to-edge); and sizable quantities of hazardous chemical waste following deposition. The addition of ammonium iodide ($NH_4I$) influences lead selenide grain size and morphology and increases its lattice parameter suggesting iodine ($I_2$) incorporates into the lead selenide crystals during deposition.

Lead selenide thin films require oxidation into lead selenite ($PbSeO_3$) followed by iodization (sensitization process) to enable an MWIR photoresponse by incorporating and activating iodine in the polycrystalline film, within and in-between the individual PbSe grains. These additions significantly improves the lead selenide thin film photoresponse. The addition of potassium iodide (KI) is known to improve lead selenide photoresponse. However, precise doping CBD films with potassium iodide is inherently difficult due to the poor control of the CBD process.

All deposition methods require thermal sensitization, which is highly dependent on adequate process control during film deposition. Lead selenide films are often near stoichiometrically balanced (1:1); however, this is highly dependent on the deposition method and conditions during material deposition. Intrinsic lead selenide (whether p-type or n-type) is not IR responsive without additional processing referred to as sensitization, i.e., thermal annealing or oxidation.

This disclosure describes a novel technique for depositing polycrystalline thin films to provide an alternative deposition method from conventional operations. Efforts sought to advance both the understanding of the mechanism behind lead selenide photoconduction and controlling the material properties of polycrystalline lead selenide thin films. The exemplary thin film deposition process is called laser sinter deposition (LSD).

The exemplary LSD process comprises three simple steps to produce nanoparticles, uniformly deposit them on a substrate, and selectively laser sinter the particles into a dense polycrystalline thin film. Additionally, the LSD process solves many of the challenges with other methods by providing rapid processing reducing selenium loss, and superior film-to-substrate adhesion suffered by CBD. For electrical isolation between conductive thin films and the silicon substrate, the lead selenide film has been deposited on silicon (Si) substrates with a 2.0 µm thick thermally grown glass ($SiO_2$) layer.

The laser sinter deposition method is in its infancy, but is maturing rapidly and offers many advantages including simplicity, low cost, and a reduction of hazardous waste compared to other methods. In addition to being an improved method for depositing lead selenide, LSD can also be used to address the problem of traditional deposition methods such as improved substrate adhesion, ultra-rapid thermal annealing, and in situ doping. Surface treatments using lasers have a long history. However, none has reported expanding the laser processing to sinter nanocrystal powders of lead selenide for thin film applications.

LSD offers the advantage of enabling spatially defined sintering, rapid sintering to promote doping with depth control, reorganizing of crystalline structures including defect reduction, and the trapping of non-equilibrium structures. Another advantage of LSD is the ability for selective depth sintering (SDS) by exploiting the absorption depth of different laser wavelengths in the lead selenide material.

FIG. 1 shows a representational view 100 of the LSD process operations: first 110, ball milling; second 120, centrifugal deposition; and third 130, laser sintering. These operations employ the following equipment: a ball mill 140 in the first step 110, a centrifuge 150 in the second step 120, and a laser 160 with an emitter 170 of coherent laser light in the third step 130. The ball mill 140 reduces the lead selenide into fine nanocrystal (NC) powder.

Figure 2:
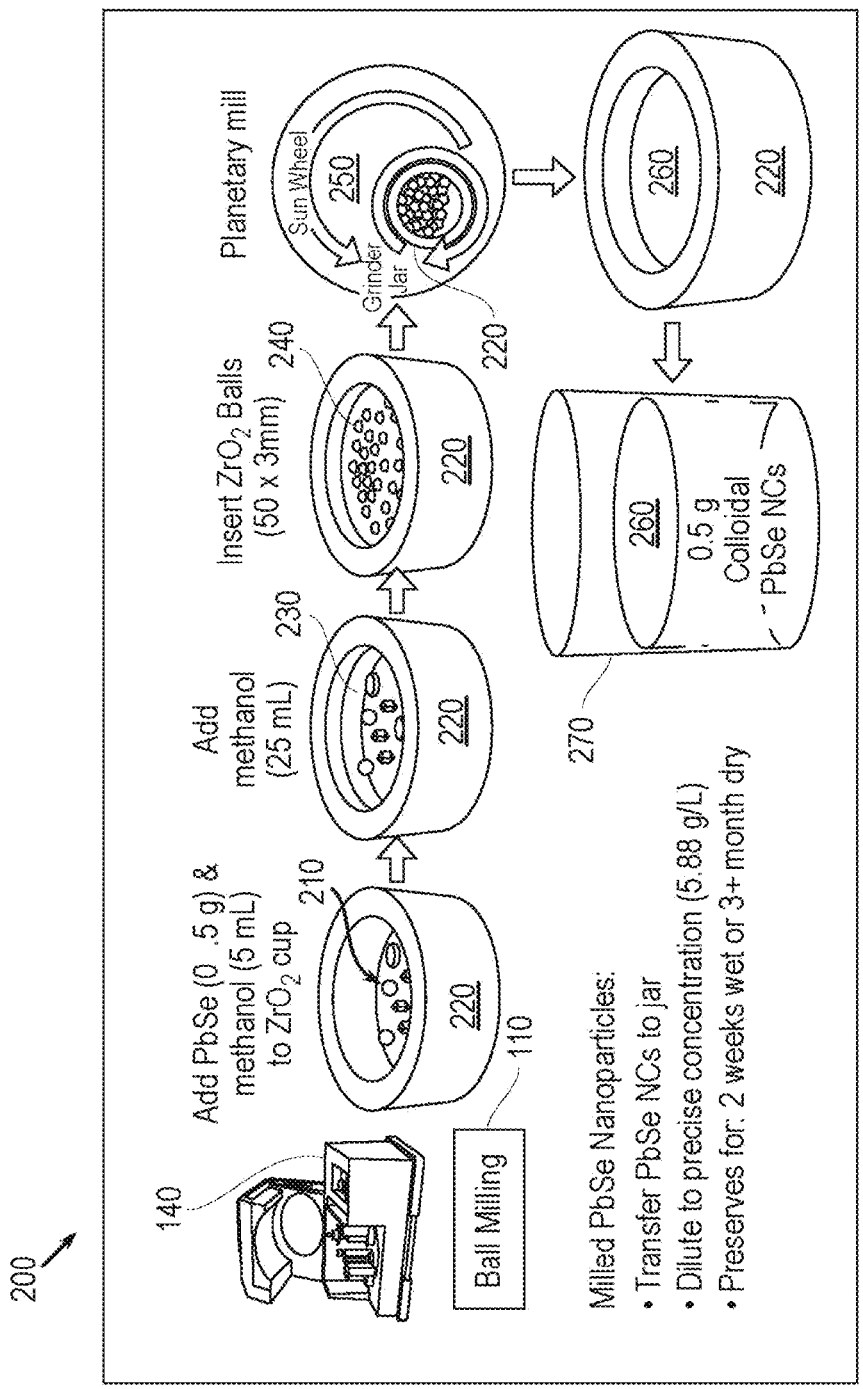
FIG. 2 is a representational view of a particulate milling operation.

FIG. 2 shows a representational view 200 of the ball milling in the first operation 110. An ingot 210 of 0.5 g of lead (II) selenide from Sigma Aldrich is inserted into a zirconium oxide ($ZrO_2$) cup 220 that serves as a mortar. Then, 25 mL of methanol 230 is added into the cup 220, followed by fifty zirconium oxide balls 240, each ball being 3 mm in diameter. The methanol 230 acts as the solvent for wet ball milling. The cup 220 is disposed into a planetary wheel arrangement 250 of the ball mill 140 to grind the lead selenide. In particular, the Retch Planetary Ball Mill (model PM100) is used for this purpose.

The wheel arrangement 250 includes a planetary platform rotating opposite the cup 220. The lead selenide is wet ball milled to form lead selenide NC particles suspended in methanol 230 as an NC colloidal suspension 260 within the cup 220. The colloidal suspension 260 can then be transferred to a storage jar 270. This suspension 260 can be diluted to a concentration of 5.88 g/L. The NC powder can be stored for two weeks wet or in excess of three months dry.

The ideal coarseness of the NC powder for the LSD process is a particle size distribution between 50 nm-2 μm per inspection by scanning electron microscopy (SEM). High-energy wet-milling with a planetary ball mill is a safe and effective way to form fine NC powders—finer than 100 nm suspended in a solvent. Selenium loss in lead selenide is known to occur under elevated temperatures, so careful consideration was given during the ball milling process to minimize heating from friction.

To reduce contamination of the powder media during ball milling, a 50 mL zirconium oxide ($ZrO_2$) ball milling cup 220 and 3 mm ball grinding material 240 were employed. Zirconium oxide is chosen specifically for its hardness (~7.9 Mohs) and purchased directly from Retsch Inc. Both agate and stainless steel ball milling (cup and ball material) were evaluated as well, but these caused considerable contamination due to erosion of the ball 240 and cup 220 material during the ball milling process. For this reason, zirconium oxide or harder material is necessary for the LSD process. Following ball milling, the concentrated colloidal suspension 260 of lead selenide NC particles in methanol 230 is transferred to a storage jar 270 or other container, and diluted to a predetermined concentration for the subsequent deposition process.

The first step 110 employs a planetary ball mill 140 to form high purity (99.99%) and stoichiometrically balanced (50:50) lead selenide NC powder from lead selenide ingot 210. A wet-ball milling process is necessary to obtain fine NC powder, reduce frictional heat buildup during the milling process, and safely contain the NC particles in colloidal form as a suspension 260 for storage in the jar 270. Several solvents were evaluated, and methanol ($CH_3OH$) was determined to be ideal for forming and suspending the lead selenide NC powder in colloidal form. Additionally, methanol 230 maintains an established concentration of lead selenide powder in a colloidal suspension 260 for ultrasmall and accurate dosing during the subsequent centrifuge deposition process.

FIG. 3 shows a tabular view 300 of values related to post-milling concentrate together with methanol dilution parameters. The post-milling lead selenide concentrate 310 compares silicon substrate sizings and respective quantities of milled NCs as well as methanol solvent. The methanol-centrifuge distribution 320 for these substrates compares solution volume, vial NC content, vial size and solvent quantities by vial.

Figure 4:
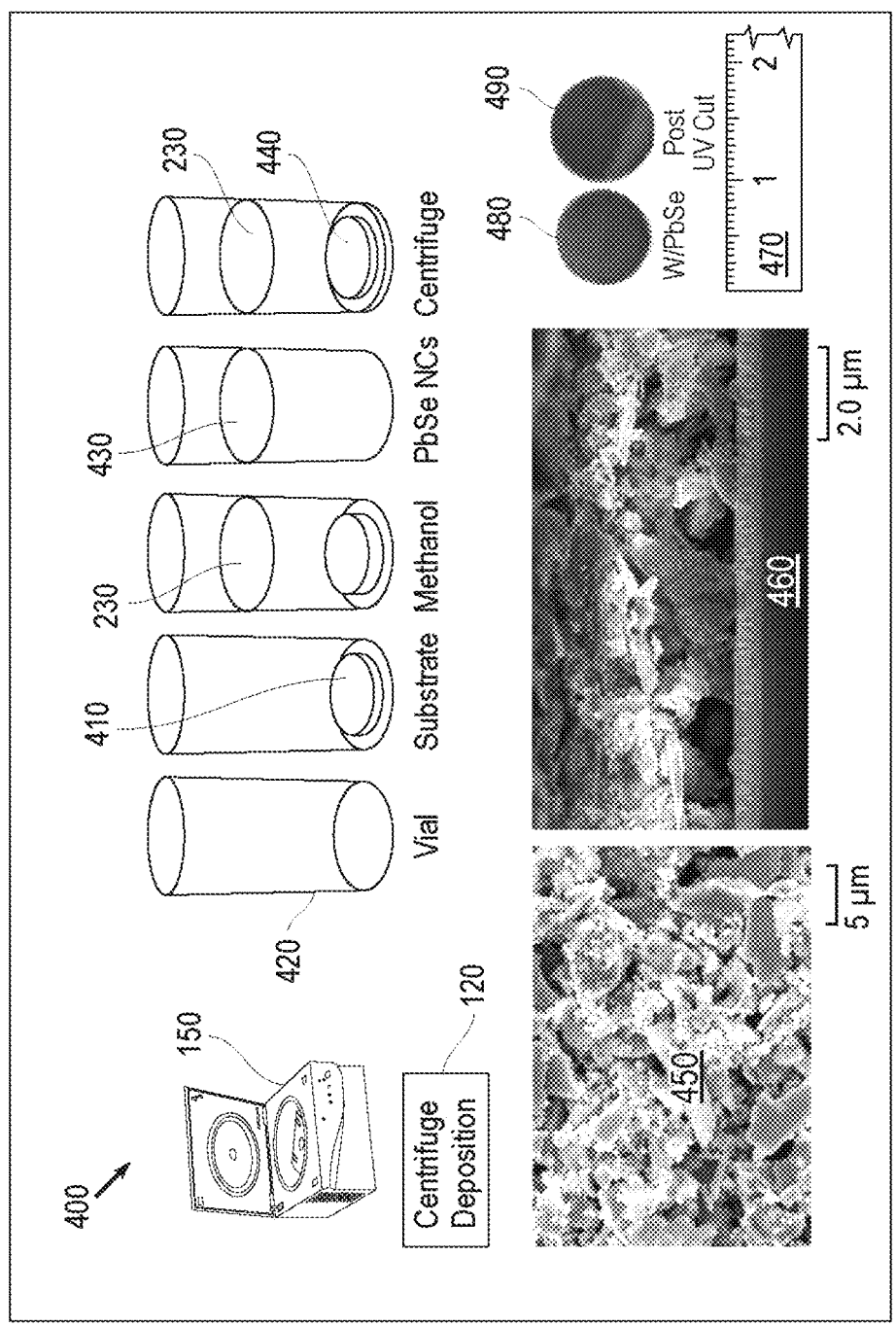
FIG. 4 is a representational view of a centrifugal separation operation.
Figure 5:
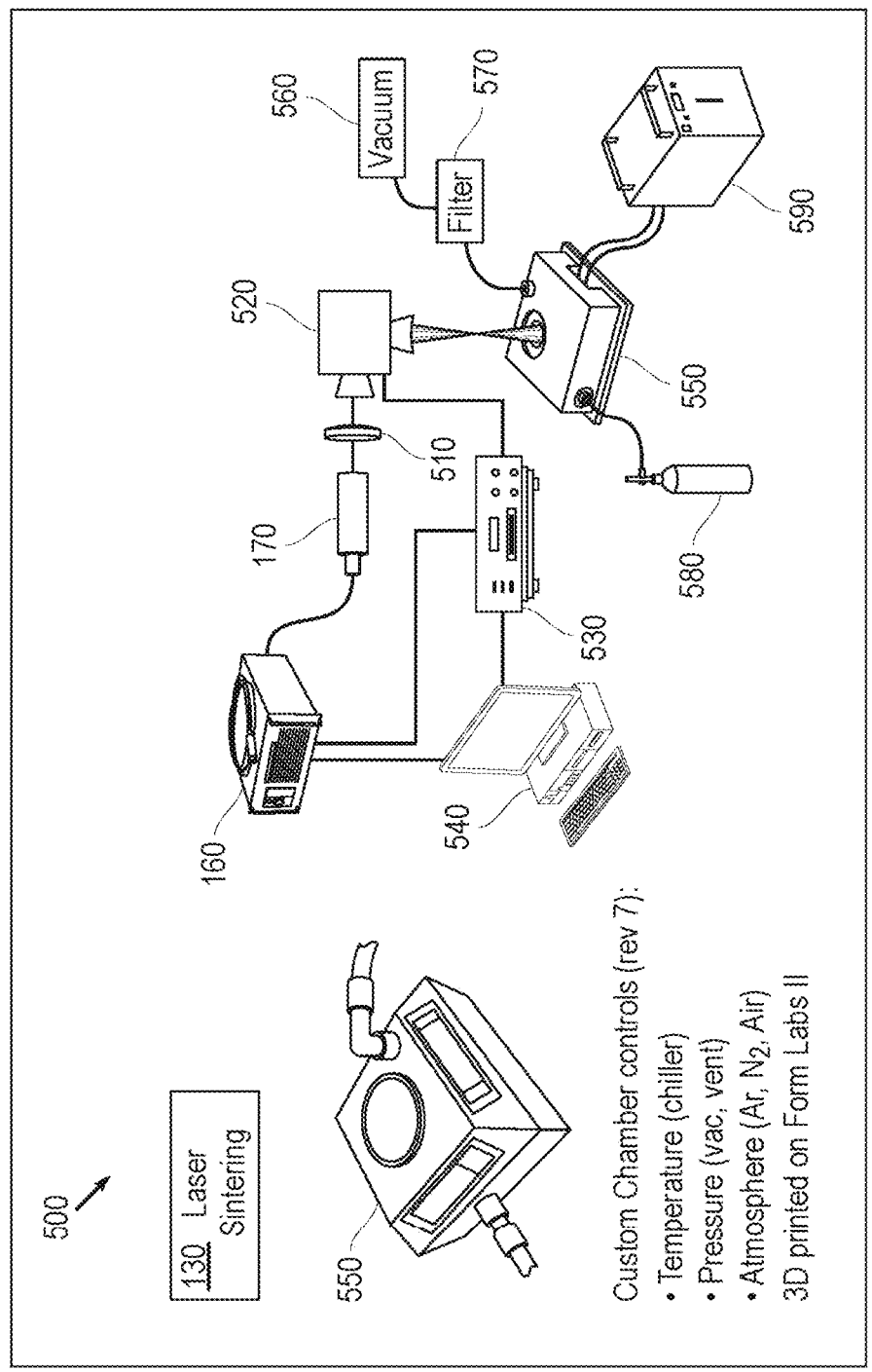
FIG. 5 is a representational view of an infrared laser sintering operation.

FIG. 4 shows a representational view 400 of the centrifugal deposition in the second operation 120. A substrate 410 is inserted into a vial 520 for spinning in a tabletop centrifuge system 150. The substrate 410 can be silicon (Si) or alternatively a silicon foundation covered by a layer of glass ($SiO_2$) from oxygen exposure. Before the spin process, methanol 230 is added to the vial 420, followed by lead selenide powder (formerly stored in a jar 270) to form a colloidal suspension 430 (distinguishable from suspension 260 depending on similar or different concentration levels).

To separate the lead selenide NCs and densify the powder, the vials 420 are spun in the centrifuge 150 at ~4,000 rpm (~3,200 g's) for 15 minutes. As the centrifuge 150 spins, centrifugal forces rotate the vials 420 on hinges so the substrate 410 faces normal to the spin axis. (This contrasts with Wang, which rotates a deposition platform on a turntable.) After being spun in the centrifuge 150, the contents of the vial 420 have separated into the methanol 230 and a concentrated thin layer of slurry 440 of the substrate 410 enveloped by the lead selenide NCs as a compact thin film of micro- and/or nanocrystals atop the substrate 410.

This is achieved by ultrasonication to uniformly disperse a known concentration of lead selenide NC particles in methanol 230 and using an adjustable micro-pipette to consistently draw a precise and predetermined amount of suspension 260. A targeted substrate 410 is then positioned at the bottom of the vial 420 and partially filled with fresh methanol 230. The micro-pipette is used to draw a set amount of lead selenide for transfer to the vials 420 of methanol 230 containing the substrates 410.

The concentrated colloidal suspension 260 suspended in methanol 230 undergoes ultrasonic exposure and is extracted by pipette. Tabular view 300 identifies two sizes of substrates 410: small 10 mm, 20 mm wafer pieces and 50 mm diameter (circular) wafers. The wafer pieces are disposed in vials 420 with lids (20 mL or 200 mL, respectively) partially filled with pure methanol 230 in precise amounts for a predetermined thickness of lead selenide.

Uniform dispersion is maintained in the vial 420 by further ultrasonication in a bath as the suspension 430. The centrifuge 150 precipitates the colloidal particles and packs them onto the substrate 410 as an amorphous film 440. The methanol 230, now clear, can be removed from the vial 420. This is followed by drying the substrate 410 on a hot plate at 75° C. for 5 minutes after removal from the vial 420. A cross-section SEM photograph 450 of deposited crystalline lead selenide includes a 5 μm scale for visual reference. A cross-section SEM photograph 460 with a 2 μm scale for reference. Ruler 470 provides linear scale for pre-UV 480 and post-UV 490 cutting of the substrates 410 via an UV laser. The UV laser is used to cut larger substrates into small pieces compatible with the vial size, chamber opening and field-of-view for the galvo laser.

The final step 130 of the LSD process employs a 1070 nm laser 160 with its IR emitter 170 to sinter and densify the lead selenide powder as NC particles. Infrared light from the emitter 170 passes a beam broadener 510 and into a galvo scanner 520. A controller 530 monitored by a computer 540 controls the scanner 520 and laser 160. The scanner 520 directs a scanning beam through a distortion minimizing window into a three-dimensional (3D) printed chamber 550, which is evacuated by a vacuum 560 interposed by a filter 570. Because of the toxicity of lead selenide, the chamber should be sealed from human exposure. The substrate 410 is maintained at a constant temperature. The chamber 550 is purged with argon (Ar) from a pressure tank 580. Alternatively, the chamber 550 can be filled with nitrogen ($N_2$) or oxygen ($O_2$).

Figure 6:
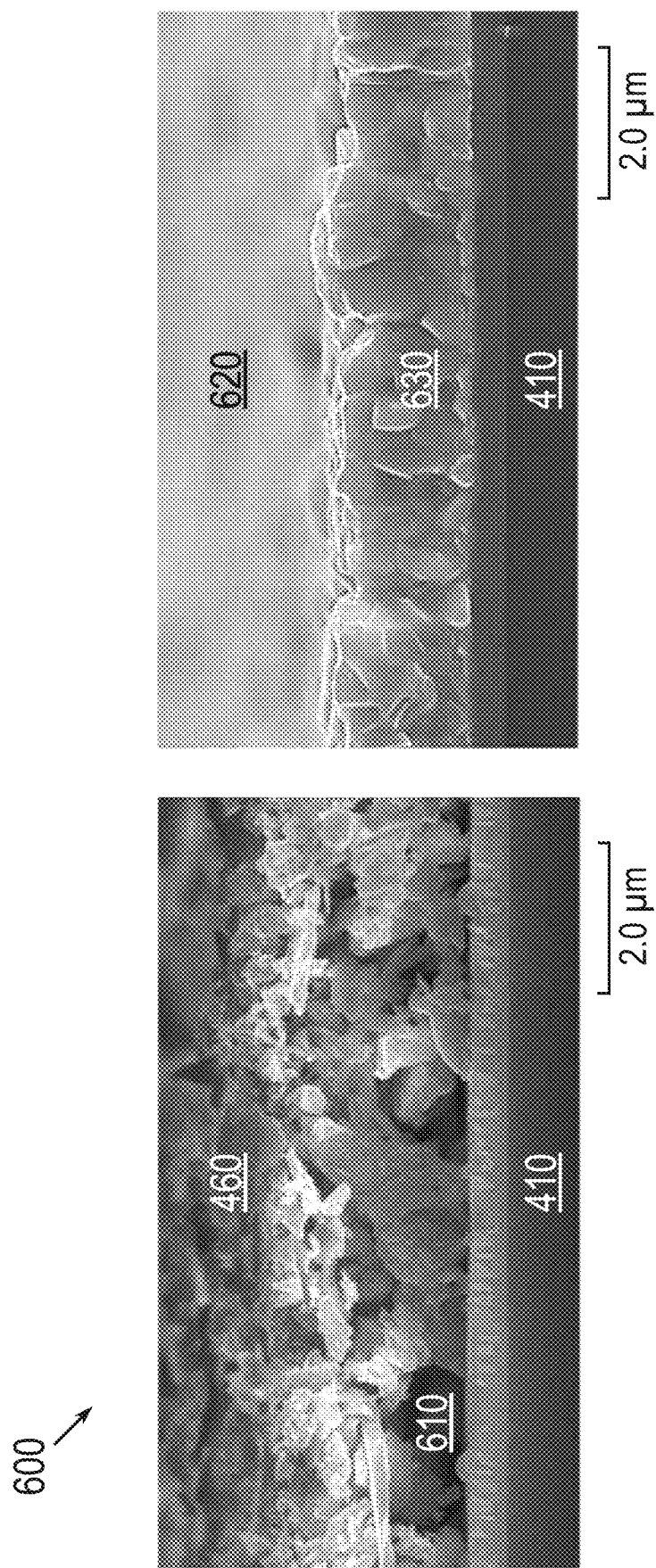
FIG. 6 is a pair of photographic cross-section microscope views of pre- and post-sinter lead selenide depositions on a substrate.

FIG. 6 shows photographic views 600 of SEM cross-section images with a scale of 2 μm for reference. The left image 460 shows the uniformly deposited crystalline lead selenide layer 610 uniformly deposited onto the substrate 410 from the second step 120. The right image 620 shows lead selenide thin film 630 sintered onto the substrate 410 after the third step 130. The compact lead selenide nanocrystal particles in layer 610 are shown after deposition, while the fused lead selenide crystaline film 630 is shown after sintering. One can observe the densification and equiaxial polycrystalline grain formation, as well as the lack of separation with the substrate 410.

The infrared laser 160 with 1070 nm wavelength is ideal for adequate absorption and sintering of a 0.5 μm-1.5 μm thin film 630 of lead selenide NC particles, which absorb the mid-infrared wavelength for sintering and recrystallizing the NCs, but also enable sufficient transmission to heat the silicon substrate 410 to achieve superior adhesion while simultaneously forming a polycrystalline thin film 630. By contrast, conventionally CBD deposited thin films of lead selenide require substrate treatment and roughening for adhesion of the film but nonetheless suffer from flaking and delamination.

Various types of laser 160 were evaluated to assess the effect of different wavelengths in the sintering of lead selenide NCs and the interactions with the substrate 410. The laser types evaluated include: (a) long pulse (100 μs) IPG fiber YAG of 1070 nm wavelength, (b) nanosecond short-pulse (50 ns) IPG fiber laser of 1064 nm wavelength, and (c) a diode-pumped solid-state (DPSS) short-pulse (25 ns) laser (Coherent MATRIX) of 355 nm wavelength (UV).

The YAG laser from IPG Photonics (model YLR-150/1500) with a 1070 nm wavelength was most promising, permitting both pulsed and continuous-wave options, and this IR wavelength had the potential to improve film adhesion by simultaneously heating the silicon substrate 410. Spot size, raster scan speed, line-scan pitch, and power were the primary laser parameters evaluated. The 1070 nm wavelength fiber laser set to continuous wave (CW) has a maximum power of 150 W with a Gaussian beam profile.

Based on preliminary sintering experiments in both CW and pulsed modes (QPW) a 600 μm spot size was chosen by adjusting the distance from the gavlo scanner 520. To enable sufficient overlap between line scans, a 50% line-scan pitch was initially chosen. An adequate balance was achieved to sufficiently sinter the lead selenide, yet minimize thermal stress and permit recrystallization of the lead selenide. Substrate heating plays a key part in film adhesion. Slow rastering induces loss of selenium as well as partial melting, balling, ablation, and excessive substrate heating. Scanning too rapidly leads to incomplete recrystallization and high film stress.

Significantly different conditions were used for QPW (quasi pulsed-wave) experiments due to the high pulse energy, leading to a more rapid material heating and cooling cycle. This could aid in minimizing selenium loss, but could potentially induce higher film stress compared to CW. This may minimize the need for substrate cooling and loss of selenium during the laser sintering operation. Preliminary results necessitated a lower power be used (24 W average, 165 W peak) with a tighter raster pitch due to the short pulses and heat dissipation (85% overlap and a scan speed of 100 mm/sec).

The generic sensitization process for lead selenide to augment photoresponsivity is summarized into two thermal process steps. Most often, the first step is thermal oxidation or annealing in air at a temperature between 280° and 480° C., followed by a second thermal step of iodization performed at a lower temperature of 285° C. to 325° C. During this second step, iodine ($I_2$) interacts with the previously formed oxidized lead selenite ($PbSeO_3$) having transformed from lead selenide (PbSe). This forms a surface layer of lead iodide ($PbI_2$). The lead iodide layer that forms on the surface during iodization necessitates this temperature to remain below the melting point for lead iodide of 410° C.

The exemplary laser sintering method has successfully been used to fabricate the lead selenide thin films. Before laser sintering, the layer 610 is a loosely packed layer of ball-milled lead selenide crystallites with a huge surface-to-volume ratio. A small dose of potassium iodide is introduced by drip casting to dissolve in methanol (0.18 μM) for all samples, although potassium iodide incorporation was omitted from experiments when appropriate, such as for control samples (no iodine) when exploring the effect of iodization on grain growth and morphology.

The thermal sensitization processing was performed using an instrumented temperature-controlled INSTEC chamber, capable of both cooling to −190° C. and heating to 600° C. The oxidation step was performed in the chamber at 460° C. for varying durations with ambient air as an oxygen source. The iodization process was conducted by sublimating solid iodine pellets heated to 105° C. Argon (Ar) gas was used to transport the iodine ($I_2$) vapor through a heated glass tube to an ionization transfer chamber milled from a solid silver block fabricated by INSTEC. The lead selenide sample was heated to 325° C. inside the iodization chamber for varying durations to compare results.

Grain measurements were taken with SEM (20k× magnification) before and after the thermal anneal. After a brief anneal (1.5 hours at 475° C.), grains exposed to potassium iodide (6.0 μM drip cast) grew, on average 60%, while grains without such exposure only grew 12%. This demonstrated that iodization contributed to grain length.

Exemplary embodiments demonstrate a new technique for forming a polycrystalline thin film of lead selenide, not reported by any other research group as of the time of its publication. Results demonstrate that not only can LSD sufficiently reproduce conventional CBD equivalent thin films of lead selenide (chemically, compositionally, morphologically, and electrically), but the exemplary LSD process can address and improves CBD.

The exemplary LSD process is spatially tailorable, improves substrate adhesion, offers rapid laser treatments that can expand the understanding behind lead selenide, and offers a tool for the experimental fabrication of thin lead selenide films. The exemplary process is repeatable. The biggest factors in film quality are dependent on the ball milling as first step 110 and centrifuge process as second step 120 producing a tightly packed pre-sintered film as well as the correct dosing of potassium iodide before laser sintering as third step 130. This exemplary technique is by no means limited to lead selenide and demonstrates many advantages over conventional methods to advance the knowledge of the photoresponse mechanism of lead selenide.

By comparison, conventional CBD suffers from film adhesion due to the chemical nature of the wet processing and lack of surface texture on the substrates, usually glass. This has resulted in manufacturers pre-treating their wafer surfaces by roughening or other processing that takes additional time and expense. Still, CBD suffers from delamination. The exemplary laser sinter deposition process has been shown to improve the film adhesion for tightly packed nanocrystals following the ball milling and centrifuge process, but laser processing is not restricted to LSD. Similar laser processing has been shown to be effective for improving the adhesion of even traditionally deposited lead selenide films.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A laser sintering deposition method for disposing lead chalcogenide onto a substrate, said method comprising:
    wet-milling a lead chalcogenide ingot mixed with methanol into a colloidal slurry containing nanocrystal particles;
    separating said colloidal slurry into said nanocrystal particles and said methanol;
    depositing said nanocrystal particles to a substrate; and
    emitting coherent infrared light onto said nanocrystal particles for fusing into a lead chalcogenide crystalline film.

2. The method according to claim 1, wherein said wet-milling operation includes:
    disposing said lead chalcogenide ingot into a mortar;
    adding zirconium oxide balls and said methanol into said mortar;
    milling said ingots into said colloidal slurry in said mortar; and
    transferring said colloidal slurry from said mortar to a vial.

3. The method according to claim 1, wherein said separating operation includes:
    disposing a substrate into a vial;
    disposing said colloidal slurry onto said substrate in said vial;
    spinning said vial in a centrifuge, thereby causing said methanol to separate from a particulate layer of said nanocrystalline particles;
    removing said methanol from said vial; and
    drying said substrate with said particulate layer.

4. The method according to claim 1, wherein said emitting operation includes:
    disposing said substrate with said particulate layer into a chamber; and
    emitting light from an infrared laser into said chamber and onto said particulate layer for fusing into said crystalline film that adheres to said substrate to form a lead chalcogenide coated sample.

5. The method according to claim 4, wherein said laser emits said coherent light at a wavelength of 1070 nm.

6. The method according to claim 4, wherein said chamber is purged with argon.

7. The method according to claim 1, wherein the lead chalcogenide in said crystalline film is a compound comprising at least one of lead sulfide, lead selenide and lead telluride.

8. The method according to claim 1, wherein the substrate is silicon with a silicon dioxide layer.

9. A laser sintering deposition method for disposing lead selenide onto a substrate, said method comprising:
    wet-milling a lead selenide ingot mixed with methanol into a colloidal slurry containing nanocrystal particles;
    separating said colloidal slurry into said nanocrystal particles and said methanol;
    depositing said nanocrystal particles to a substrate; and
    emitting coherent infrared light onto said nanocrystal particles for fusing into a lead selenide crystalline film.

10. The method according to claim 9, further including:
    exposing said lead selenide film to oxygen to form a lead selenite layer; and
    exposing said lead selenite layer to iodine to produce a lead iodide layer onto said lead selenite layer.

11. The method according to claim 9, further including after said depositing said nanocrystal particles to said substrate operation:
    drip casting potassium iodide onto said nanocrystal particles.

12. The method according to claim 9, wherein said wet-milling operation includes:
    disposing said lead selenide ingot into a mortar;
    adding zirconium oxide balls and methanol into said mortar;
    milling said ingots into said colloidal slurry in said mortar; and
    transferring said colloidal slurry from said mortar to a vial.

13. The method according to claim 9, wherein said lead selenide ingot has a mass of 0.5 g.

14. The method according to claim 12, wherein said zirconium oxide balls are 3 mm in diameter.

15. The method according to claim 9, wherein the substrate is silicon with a silicon dioxide layer.

* * * * *